US010714891B2

(12) United States Patent
Kuo et al.

(10) Patent No.: US 10,714,891 B2
(45) Date of Patent: Jul. 14, 2020

(54) PROJECTOR, ELECTRONIC DEVICE HAVING PROJECTOR AND ASSOCIATED MANUFACTURING METHOD

(71) Applicant: HIMAX TECHNOLOGIES LIMITED, Tainan (TW)

(72) Inventors: Han-Yi Kuo, Tainan (TW); Yun-Lien Hsiao, Tainan (TW); Shi-Jen Wu, Tainan (TW); Yin-Dong Lu, Tainan (TW)

(73) Assignee: HIMAX TECHNOLOGIES LIMITED, Tainan (TW)

( * ) Notice: Subject to any disclaimer, the term of this patent is extended or adjusted under 35 U.S.C. 154(b) by 6 days.

(21) Appl. No.: 16/028,436

(22) Filed: Jul. 6, 2018

(65) Prior Publication Data

US 2020/0014172 A1 Jan. 9, 2020

(51) Int. Cl.
*G03B 21/14* (2006.01)
*H01S 5/022* (2006.01)
*H01S 5/02* (2006.01)
*H04N 5/225* (2006.01)
*G06T 7/521* (2017.01)

(52) U.S. Cl.
CPC ........ *H01S 5/02288* (2013.01); *G03B 21/145* (2013.01); *G06T 7/521* (2017.01); *H01S 5/0215* (2013.01); *H01S 5/02236* (2013.01); *H04N 5/225* (2013.01); *G06T 2207/10028* (2013.01); *G06T 2207/10048* (2013.01)

(58) Field of Classification Search
CPC .... G03B 21/28; G03B 21/145; G03B 21/208; G03B 21/625; G03B 21/2053; H01S 5/0085; H01S 5/141; H01S 5/0265; H01S 5/02288; H01S 5/4087
See application file for complete search history.

(56) References Cited

U.S. PATENT DOCUMENTS

| | | | |
|---|---|---|---|
| 5,718,496 A * | 2/1998 | Feldman | G02B 5/1842 353/42 |
| 10,359,693 B2 * | 7/2019 | Takagi | G03B 21/208 |
| 10,409,144 B2 * | 9/2019 | Popovich | G03F 7/70316 |
| 2008/0240502 A1 * | 10/2008 | Freedman | G01B 11/2513 382/103 |
| 2009/0103923 A1 | 4/2009 | Hosomi | |
| 2013/0038881 A1 | 2/2013 | Pesach | |
| 2013/0301013 A1 * | 11/2013 | Samejima | G02B 19/0028 353/52 |
| 2014/0376092 A1 | 12/2014 | Mor | |
| 2015/0211724 A1 | 7/2015 | Goutain | |
| 2016/0178915 A1 | 6/2016 | Mor | |

(Continued)

FOREIGN PATENT DOCUMENTS

JP 2001-284731 A 10/2001
JP 2004-274064 A 9/2004

(Continued)

*Primary Examiner* — Sultan Chowdhury
(74) *Attorney, Agent, or Firm* — Winston Hsu

(57) ABSTRACT

The present invention provides a projector including a substrate, a laser module and a lens module. The laser module is positioned on the substrate, and a laser diode of the laser module is not packaged within a can. The lens module is arranged for receiving a laser beam from the laser diode of the laser module to generate a projected image of the projector.

13 Claims, 6 Drawing Sheets

(56) References Cited

U.S. PATENT DOCUMENTS

| | | |
|---|---|---|
| 2017/0131560 A1 | 5/2017 | Liao |
| 2017/0187997 A1 | 6/2017 | Hsiao |
| 2019/0097722 A1* | 3/2019 | McLaurin ............. H01S 5/4012 |

FOREIGN PATENT DOCUMENTS

| | | |
|---|---|---|
| JP | 2011-66028 A | 3/2011 |
| JP | 2011-102901 A | 5/2011 |
| JP | 2014-228558 A | 12/2014 |
| JP | 2017-120364 A | 7/2017 |
| KR | 10-2009-0040860 A | 4/2009 |
| KR | 10-2017-0077761 A | 7/2017 |
| TW | M461075 U1 | 9/2013 |
| TW | I584047 B | 5/2017 |

* cited by examiner

PROJECTOR, ELECTRONIC DEVICE HAVING PROJECTOR AND ASSOCIATED MANUFACTURING METHOD

BACKGROUND OF THE INVENTION

1. Field of the Invention

The present invention relates to a projector, and more particularly, to a projector having a laser module with small size.

2. Description of the Prior Art

In the process of assembling a projector in a factory, a packaged laser is used with a substrate, a lens module and a holder to form the projector. A size of the projector is limited by the packaged laser because the packaged laser has a greater height. Taking a conventional TO-CAN package as an example of the packaged laser, the TO-CAN package includes many elements such as a header, a submount, a laser diode, a shell, a cap and many pins, so the height of the TO-CAN package cannot be greatly reduced. In addition, because an electronic device such as a smart phone or a pad becomes thinner, the projector with large size cannot be easily positioned into the electronic device, causing difficulties to the electronic device and/or projector design.

SUMMARY OF THE INVENTION

It is therefore an objective of the present invention to provide a projector having a laser module with smaller size, to solve the above-mentioned problem.

According to one embodiment of the present invention, a projector comprises a substrate, a laser module and a lens module. The laser module is positioned on the substrate, and a laser diode of the laser module is not packaged within a can. The lens module is arranged for receiving a laser beam from the laser diode of the laser module to generate a projected image of the projector.

According to one embodiment of the present invention, a method for manufacturing a projector is provided, wherein the method comprises: providing a substrate; positioned a laser module on the substrate, wherein a laser diode of the laser module is not packaged within a can; providing a lens module; and assembling the substrate, the laser module and lens module to make a laser beam generated by the laser diode passes through the lens module to generate a projected image of the projector.

According to one embodiment of the present invention, an electronic device comprises a projector, a camera module and a processor, wherein the projector comprises a substrate, a laser module and a lens module. The laser module is positioned on the substrate, and a laser diode of the laser module is not packaged within a can. The lens module is arranged for receiving a laser beam from the laser diode of the laser module to generate a projected image of the projector to a surrounding environment. The camera module is arranged for capturing the region of the surrounding environment to generate image data. The processor is arranged for analyzing the image data to obtain depth information of the image data.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
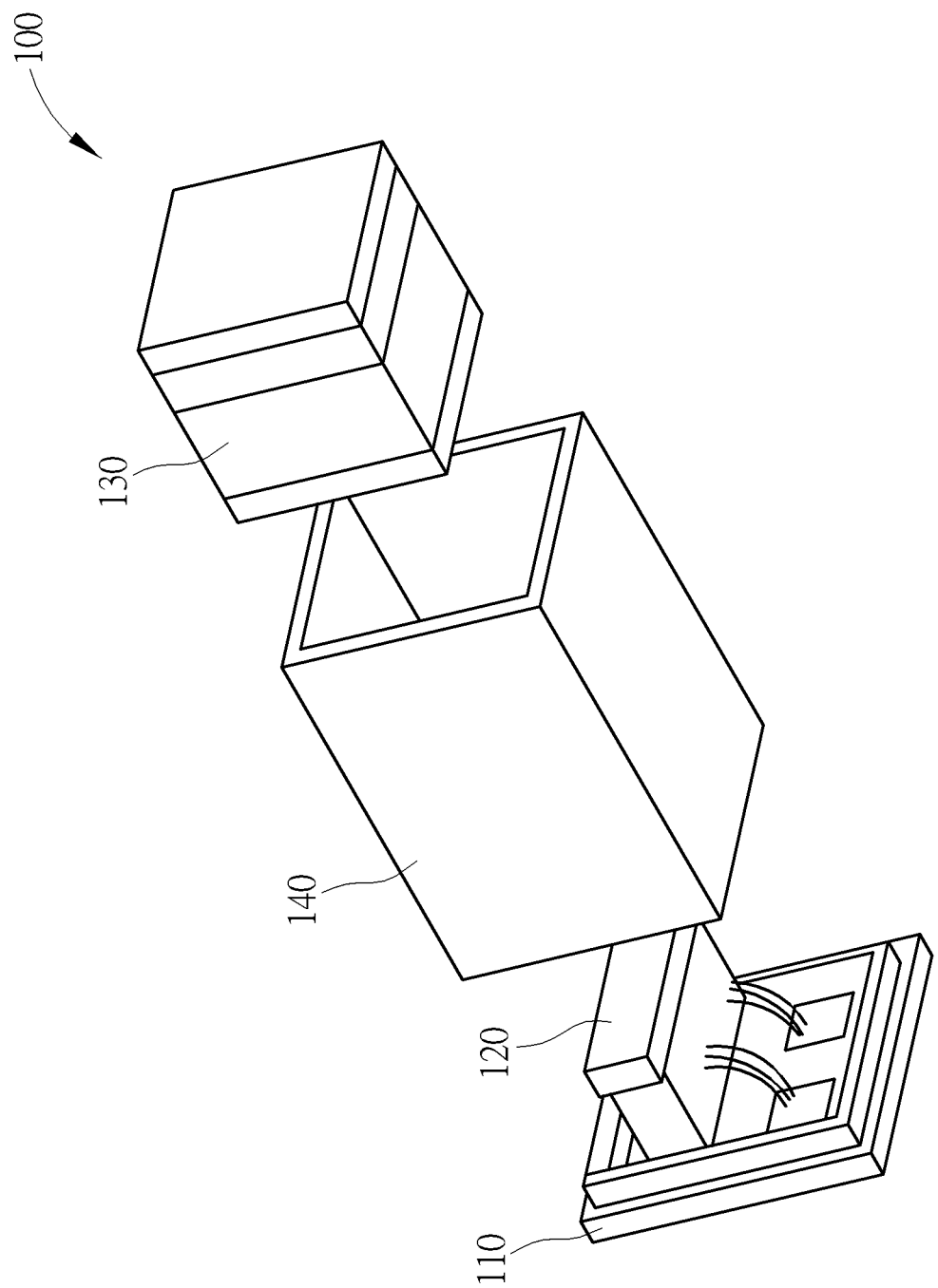
FIG. 1 is a diagram illustrating a projector according to one embodiment of the present invention.

FIG. 1 is a diagram illustrating a projector 100 according to one embodiment of the present invention. As shown in FIG. 1, the projector 100 comprises a substrate 110, a laser module 120, a lens module 130 and a holder 140. In this embodiment, the projector 100 is arranged to project an image with a special pattern, and the projector 100 is positioned in an electronic device such as a smart phone or a pad.

Figure 2:
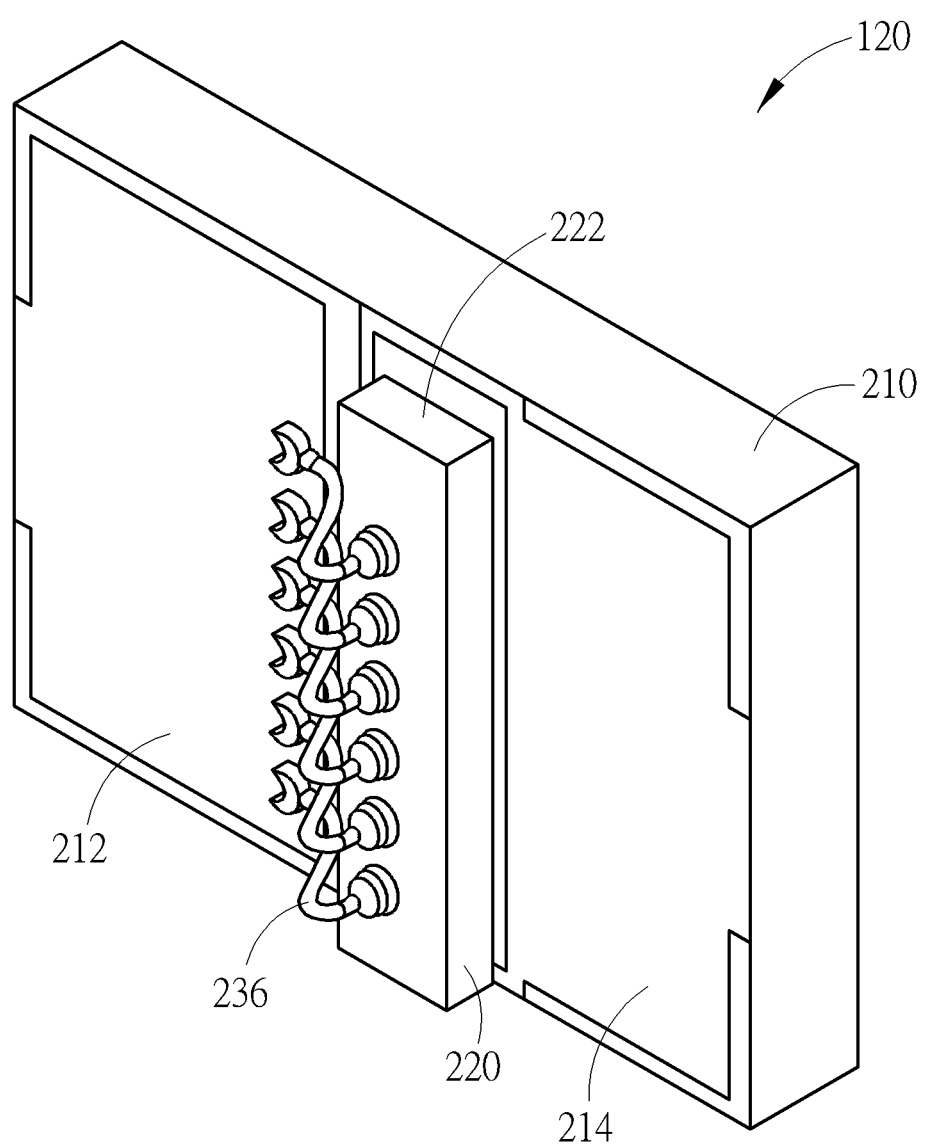
FIG. 2 shows the laser module according to one embodiment of the present invention.

FIG. 2 shows the laser module 120 according to one embodiment of the present invention. As shown in FIG. 2, the laser module 120 comprises a submount 210 and a laser diode 220 (bare die without packaging), where the submount 210 may be a cuboid or a cubic object having electrodes such as an anode 212 and a cathode 214, and the laser diode 220 is bonded to the submount 210 by using the metal wires 236. The submount 210 may be made by aluminum or ceramic or any other suitable material. In this embodiment, the laser module 120 is an edge emitting laser diode having an emission point 222, and the laser module 120 is bonded on a side plane of the submount 210, therefore, the laser module 120 may have smaller height that is suitable for the thinner electronic device.

Figure 3:
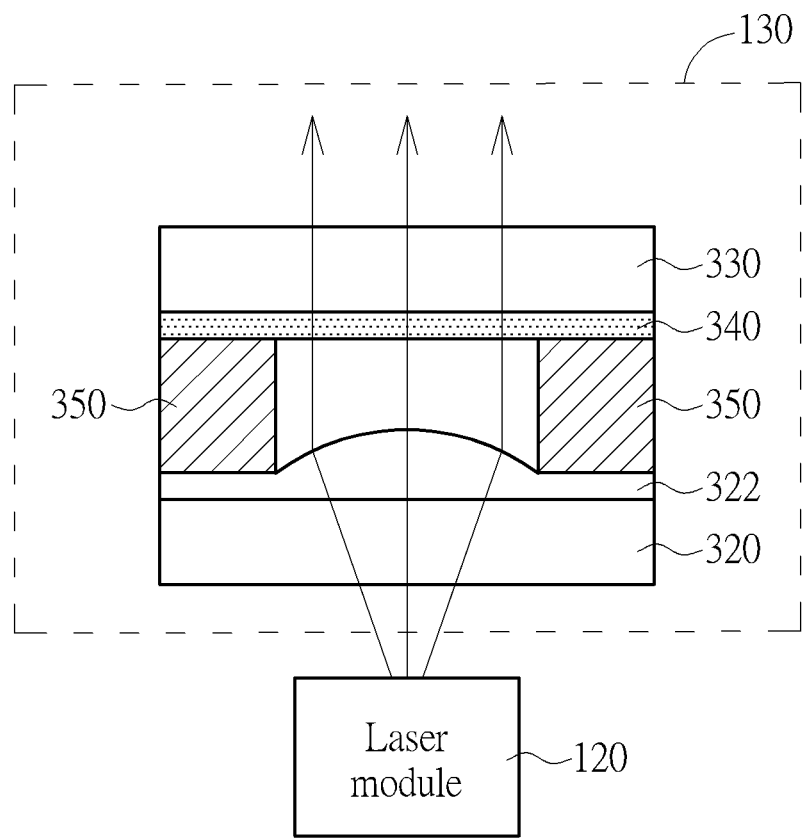
FIG. 3 shows the lens module according to one embodiment of the present invention.

FIG. 3 shows the lens module 130 according to one embodiment of the present invention, the lens module 130 comprises a substrate 320, a convex collimator lens 322 imprinted on a surface of the substrate 320, a substrate 330, a diffractive optical element (DOE) 340 imprinted on a surface of the substrate 330, and spacers 350. For the operations of the laser module 120 and the lens module 130, the laser module 120 is arranged to generate a laser beam, and particularly, the laser beam is an infrared light. The convex collimator lens 322 is arranged to receive the laser beam from the laser module 120 to generate a collimated laser beam (parallel rays), where the collimated laser beam is substantially perpendicular to the surface of the substrate 330 and the DOE 340. The DOE 340 can serve as a pattern generator, and the collimated laser beam directly passes through the DOE 340 to generate a projected image, where the projected image may have a special pattern set by the DOE 340.

It is noted that the lens module 130 shown in FIG. 3 is for illustrative purposes only. In other embodiments of the present invention, the lens module 130 may have more than one collimator lens such as two convex collimator lenses, or one convex collimator lens with one concave lens, and the DOE 340 may be imprinted on the other surface of the substrate 330.

Figure 4:
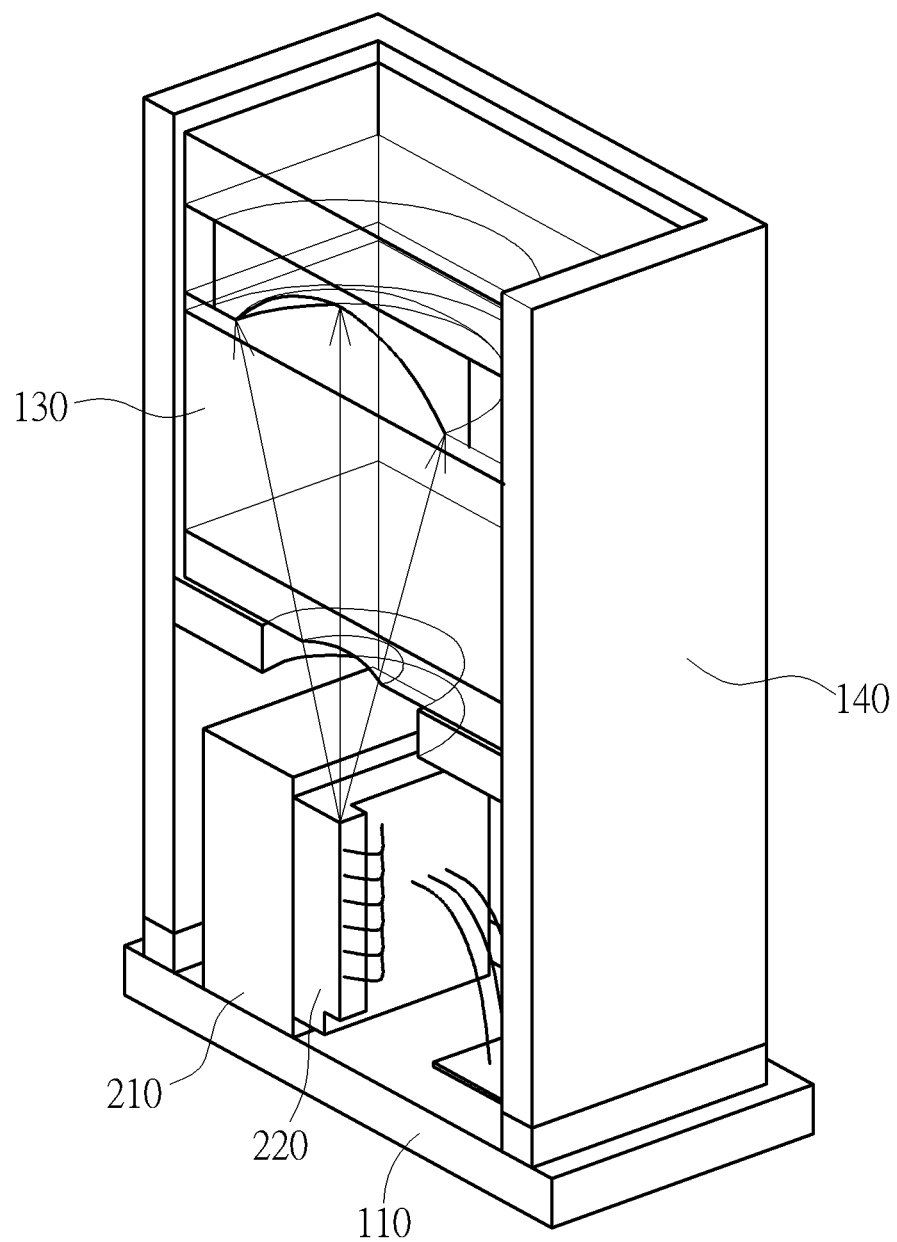
FIG. 4 shows a cross section view of the projector according to one embodiment of the present invention.

FIG. 4 shows a cross section view of the projector 100 according to one embodiment of the present invention. As shown in FIG. 4, the holder 140 and the submount 210 of the laser module 120 is adhered on the substrate 110, and the laser diode 220 is under a center of the lens module 130 so that the laser diode 220 can directly generate the laser beam to the center of the lens module 130. Besides, the submount 210 is not under the center of the of the lens module 130.

Besides the laser module 120 of the embodiment has a smaller size/height, the assembly of the elements of the projector 100 is flexible for the elements having different characteristics. Specifically, the conventional TO-CAN package must be positioned on the center of the substrate, so the projected images cannot be precisely controlled if the engineers have a special optical design of the projector. In the embodiment of the present invention, because the laser module 120 is fixed on the substrate 110 by using glue, the position of the laser module 120 can be determined by the engineers (e.g., not at the center of the substrate), or the laser module 120 may have a special horizontal rotation angle to make the laser beam have different polarities.

Figure 5:
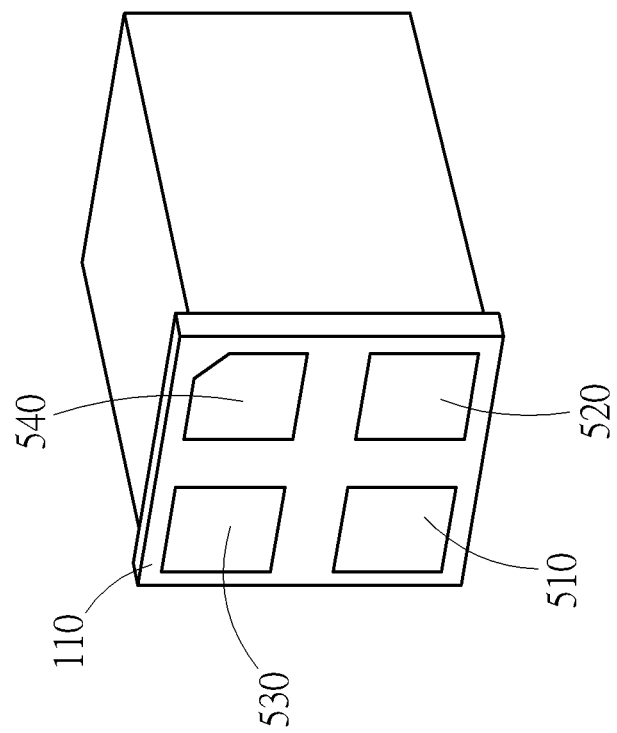
FIG. 5 shows a size of the projector and a bottom of the substrate according to one embodiment of the present invention.
Figure 5:
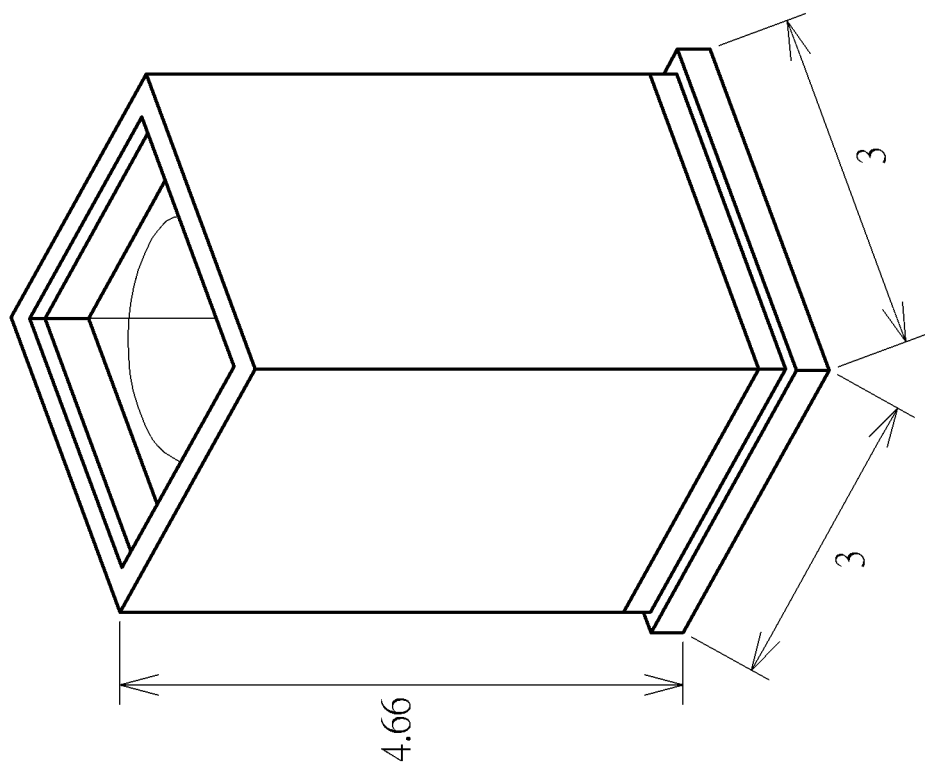

FIG. 5 shows a size of the projector 100 and a bottom of the substrate 110 according to one embodiment of the present invention. As shown in FIG. 5, the overall size of the projector 100 is 3 (mm)*3 (mm)*4.6 (mm), and the substrate 110 further comprises four electrodes 510, 520, 530 and 540 at the bottom, where the electrode 510 serves as an anode that is connected to the electrode 212, the electrode 520 serves as a cathode that is connected to the electrode 214, the electrodes 530 and 540 serve as heat sinks that is connected to the laser diode as shown in FIG. 1 and FIG. 4.

Figure 6:
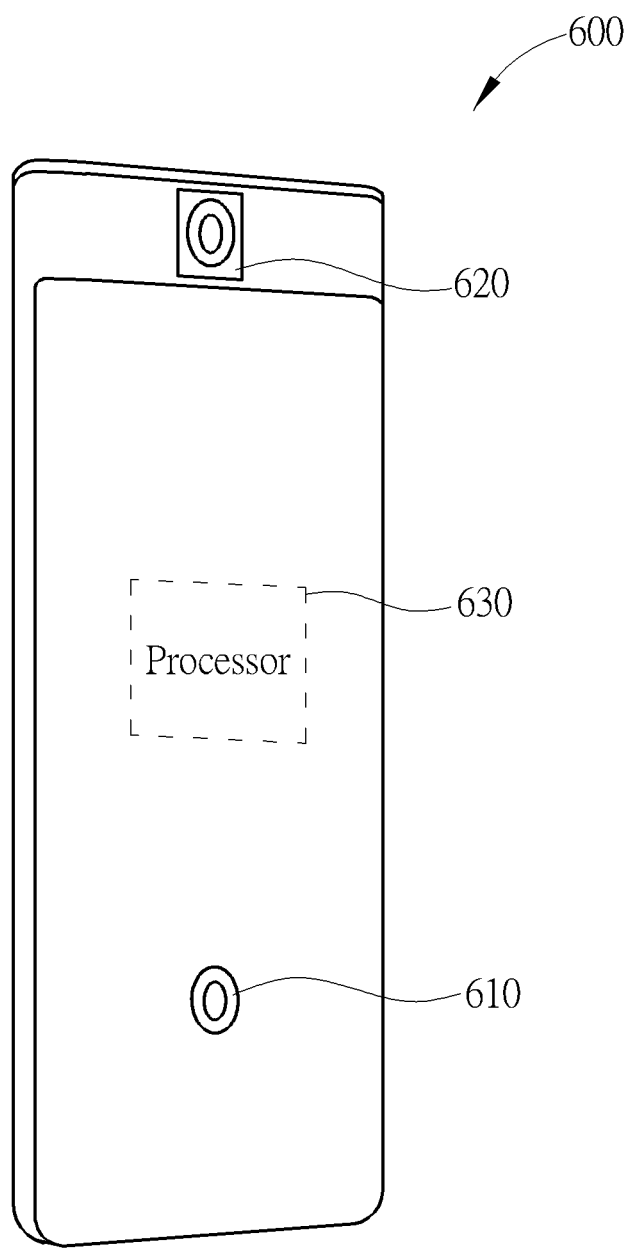
FIG. 6 is a diagram illustrating an electronic device according to one embodiment of the present invention.

FIG. 6 is a diagram illustrating an electronic device 600 according to one embodiment of the present invention. As shown in FIG. 6, the electronic device 600 is a smart phone, and the electronic device 600 comprises a projector 610, a camera module 620 and a processor 630. In this embodiment, the projector 610 can be implemented by the projector 100 shown in FIGS. 1-5, and the projector 610 is embedded in a back side of the electronic device 600, and is used to project an infrared image with a special pattern to a region of a surrounding environment. Then, the camera module 620 captures the region of the surrounding environment to generate image data. Finally, the processor 630 analyzes the image data to obtain depth information of the image data to generate a 3D image. In the embodiment shown in FIG. 6, because of the projector 100 with small size, the thickness of the electronic device 600 is not limited by the projector 100.

Briefly summarized, compared with the conventional projector using the packaged laser such as TO-CAN package, the laser module of the projector of the present invention is designed to have smaller size for the convenience of back-end product design, and the position or rotation angle of the laser module is more flexible for the assembling process in the factory.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A projector, comprising:
   a substrate;
   a laser module, wherein the laser module is positioned on the substrate, and a laser diode of the laser module is not packaged within a can; and
   a lens module, for receiving a laser beam from the laser diode of the laser module to generate a projected image of the projector;
   wherein the laser module comprises a submount having the laser diode mounted thereon, and the submount is adhered to the substrate;
   wherein when the laser module is arranged to emit the straight upward laser beam, the laser diode is under a center of the lens module, but the submount is not under the center of the lens module.

2. The projector of claim 1, wherein the laser diode is an infrared laser diode, the lens module comprises a diffractive optical element imprinted thereon, and the laser beam generated by the laser module passes through the lens module to generate the projected image having a pattern of the diffractive optical element.

3. The projector of claim 1, wherein the laser diode is a bare die without packaging.

4. The projector of claim 3, wherein the submount is a cuboid or a cubic object having electrodes, and the laser diode is bonded on the electrodes.

5. A projector, comprising:
   a substrate;
   a laser module, wherein the laser module is positioned on the substrate, and a laser diode of the laser module is not packaged within a can; and
   a lens module, for receiving a laser beam from the laser diode of the laser module to generate a projected image of the projector;
   wherein the laser module comprises a submount having the laser diode mounted thereon, and the submount is adhered to the substrate;
   wherein the laser diode is under a center of the lens module, but the submount is not under the center of the lens module;
   wherein the laser diode is an edge emitting laser diode, and the laser diode is bonded on a side plane of the submount so that the laser diode directly generates the laser beam to the center of the lens module.

6. A method for manufacturing a projector, comprising:
   providing a substrate;
   mounting the laser diode to a submount to form a laser module;
   positioning the laser module on the substrate, wherein a laser diode of the laser module is not packaged within a can;
   providing a lens module; and
   assembling the substrate, the laser module and lens module to make a laser beam generated by the laser diode passes through the lens module to generate a projected image of the projector;
   wherein the step of assembling the substrate, the laser module and lens module comprises:
   adhering the submount to the substrate;
   wherein when the laser module is arranged to emit the straight upward laser beam, the laser diode is under a center of the lens module, but the submount is not under the center of the lens module.

7. The method of claim 6, wherein the laser diode is an infrared laser diode, the lens module comprises a diffractive optical element imprinted thereon, and the laser beam generated by the laser module passes through the lens module to generate the projected image having a pattern of the diffractive optical element.

8. The method of claim 6, wherein the laser diode is a bare die without packaging.

9. The method of claim 8, wherein the submount is a cuboid or a cubic object having electrodes, and the laser diode is bonded on the electrodes.

10. A method for manufacturing a projector, comprising:
providing a substrate;
mounting the laser diode to a submount to form a laser module;
positioning the laser module on the substrate, wherein a laser diode of the laser module is not packaged within a can;
providing a lens module; and
assembling the substrate, the laser module and lens module to make a laser beam generated by the laser diode passes through the lens module to generate a projected image of the projector;
wherein the step of assembling the substrate, the laser module and lens module comprises:
adhering the submount to the substrate;
wherein the laser diode is an edge emitting laser diode, and the laser diode is bonded on a side plane of the submount so that the laser diode directly generates the laser beam to the center of the lens module.

11. An electronic device, comprising:
a projector, comprising:
a substrate;
a laser module, wherein the laser module is positioned on the substrate, and a laser diode of the laser module is not packaged within a can; and
a lens module, for receiving a laser beam from the laser diode of the laser module to generate a projected image of the projector to a region of a surrounding environment; and
a camera module, for capturing the region of the surrounding environment to generate image data; and
a processor, for analyzing the image data to obtain depth information of the image data;
wherein the laser module comprises a submount having the laser diode mounted thereon, and the submount is adhered to the substrate;
wherein the laser diode is under a center of the lens module, but the submount is not under the center of the lens module; and the laser diode is an edge emitting laser diode, and the laser diode is bonded on a side plane of the submount so that the laser diode directly generates the laser beam to the center of the lens module.

12. The electronic device of claim 11, wherein the laser diode is an infrared laser diode, the lens module comprises a diffractive optical element imprinted thereon, and the laser beam generated by the laser module passes through the lens module to generate the projected image having a pattern of the diffractive optical element.

13. The electronic device of claim 11, wherein the laser diode is a bare die without packaging.

* * * * *